(12) United States Patent
Park et al.

(10) Patent No.: US 11,793,020 B2
(45) Date of Patent: Oct. 17, 2023

(54) DISPLAY PANEL AND METHOD OF FABRICATING THE SAME

(71) Applicant: Samsung Display Co., Ltd., Yongin-Si (KR)

(72) Inventors: Seung-won Park, Seoul (KR); Wonjong Kim, Suwon-si (KR); Jongwoo Kim, Hwaseong-si (KR); Changyeong Song, Suwon-si (KR); Woosuk Jung, Yongin-si (KR); Jaeheung Ha, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 205 days.

(21) Appl. No.: 16/997,212

(22) Filed: Aug. 19, 2020

(65) Prior Publication Data
US 2021/0111373 A1   Apr. 15, 2021

(30) Foreign Application Priority Data

Oct. 10, 2019   (KR) .................... 10-2019-0125558

(51) Int. Cl.
*H10K 50/844*   (2023.01)
*H10K 71/00*   (2023.01)
*H10K 102/00*   (2023.01)

(52) U.S. Cl.
CPC .......... *H10K 50/844* (2023.02); *H10K 71/00* (2023.02); *H10K 2102/00* (2023.02)

(58) Field of Classification Search
CPC .............. H01L 51/56; H01L 2251/55; H01L 2251/52237; H01L 51/5256; H01L 51/5237; H10K 50/844; H10K 71/00; H10K 2102/00; H10K 2101/00; H10K 50/858;
(Continued)

(56) References Cited

U.S. PATENT DOCUMENTS 9,240,567 B2   1/2016   Park
2003/0193286 A1*   10/2003   Ottermann ............. H01L 21/56
                                                        313/506
(Continued)

FOREIGN PATENT DOCUMENTS

KR   1020140064395 A   5/2014
KR     101425844 B1    8/2014
KR   1020150060434 A   6/2015

OTHER PUBLICATIONS

Frank S. Bates et al., "Block Copolymers—Designer Soft Materials," Physics Today, Feb. 1999, pp. 32-38.

*Primary Examiner* — Kyoung Lee
(74) *Attorney, Agent, or Firm* — CANTOR COLBURN LLP

(57) ABSTRACT

A display panel includes a light emitting element and an encapsulation layer on the light emitting element. The encapsulation layer covers the light emitting element. The encapsulation layer includes a plurality of polymer layers including a block copolymer. The plurality of polymer layers includes a plurality of first polymer layers, each of which has a first refractive index, and a plurality of second polymer layers, each of which has a second refractive index greater than the first refractive index. A difference between the first refractive index and the second refractive index is in a range of about 0.1 to about 0.6.

19 Claims, 11 Drawing Sheets

(58) Field of Classification Search
CPC .. H10K 50/8445; H10K 50/84; H10K 50/865; H10K 59/12
See application file for complete search history.

(56) References Cited

U.S. PATENT DOCUMENTS

| | | | |
|---|---|---|---|
| 2005/0181212 A1* | 8/2005 | Schaepkens | H01L 51/5256 428/521 |
| 2012/0227809 A1* | 9/2012 | Bharti | H01L 31/0481 136/259 |
| 2015/0053951 A1* | 2/2015 | Riegel | H01L 51/5284 257/40 |
| 2016/0155975 A1 | 6/2016 | Jin et al. | |
| 2018/0047791 A1* | 2/2018 | Tsai | H01L 27/322 |
| 2019/0058161 A1* | 2/2019 | Song | C09D 133/10 |
| 2022/0154054 A1* | 5/2022 | Han | H01L 51/0043 |

* cited by examiner

DISPLAY PANEL AND METHOD OF FABRICATING THE SAME

This application claims priority to Korean Patent Application No. 10-2019-0125558, filed on Oct. 10, 2019, and all the benefits accruing therefrom under 35 U.S.C § 119, the content of which in its entirety is herein incorporated by reference.

BACKGROUND

1. Field

The invention relate to a display panel and a method of fabricating the display panel, and more particularly, to a display panel in which a light emitting element is prevented from damage caused by externally incident ultraviolet and visible rays and a method of fabricating the display panel.

2. Description of the Related Art

An organic light emitting display device typically includes an organic light emitting element including an anode, an organic emission layer, and a cathode. The organic emission layer may be vulnerable to moisture or oxygen. In such an organic light emitting display device, when moisture or oxygen externally enters the organic light emitting display device, the organic emission layer may be degenerated to produce defects such as dark spot or pixel shrinkage. Therefore, an encapsulation structure is typically used to protect the organic light emitting element.

SUMMARY

Embodiments of the invention provide a display panel in which externally incident ultraviolet and visible rays are blocked to prevent damage to a light emitting element.

Embodiments of the invention provide a method of fabricating a display panel including a simplified process to form an encapsulation layer capable of blocking externally incident ultraviolet and visible rays.

According to an embodiment of the invention, a display panel includes: a light emitting element; and an encapsulation layer on the light emitting element, where the encapsulation layer covers the light emitting element. In such an embodiment, the encapsulation layer includes a plurality of polymer layers including a block copolymer. In such an embodiment, the plurality of polymer layers includes: a plurality of first polymer layers, each of which has a first refractive index; and a plurality of second polymer layers, each of which has a second refractive index greater than the first refractive index. In such an embodiment, a difference between the first refractive index and the second refractive index may be in a range of about 0.1 to about 0.6.

In an embodiment, the block copolymer may include a first block monomer and a second block monomer different from the first block monomer. In such an embodiment, the plurality of first polymer layers may include the first block monomer, and the plurality of second polymer layers may include the second block monomer.

In an embodiment, each of the first and second block monomers may include at least one material selected from polystyrene, polymethylmethacrylate, polyethylene oxide, polydimethylsiloxane, fluorohexylethylacrylate, inorganic polymers, and inorganic nano-particles.

In an embodiment, a transmittance of light in a wavelength range of about 380 nanometers (nm) to about 420 nm in the encapsulation layer may be about 10% or less.

In an embodiment, the plurality of first polymer layers and the plurality of second polymer layers may be alternately stacked with each other.

In an embodiment, the plurality of first polymer layers and the plurality of second polymer layers may be alternately stacked with each other in two or more layers.

In an embodiment, each of the plurality of first polymer layers and the plurality of second polymer layers may have a thickness in a range of about 30 nm to about 90 nm.

In an embodiment, the light emitting element may include a first electrode, an emission layer on the first electrode, a second electrode on the emission layer, and a capping layer on the second electrode. In such an embodiment, the encapsulation layer may be on the capping layer.

In an embodiment, the encapsulation layer may further include an inorganic encapsulation layer between the light emitting element and the plurality of polymer layers.

In an embodiment, the encapsulation layer may further include an organic encapsulation layer between the inorganic encapsulation layer and the plurality of polymer layers.

In an embodiment, each of the plurality of first polymer layers may include a first sub-polymer layer and a second sub-polymer layer, and each of the plurality of second polymer layers may include a third sub-polymer layer and a fourth sub-polymer layer.

In an embodiment, each of the first, second, third, and fourth sub-polymer layers may be provided in plural, and the first, second, third, and fourth sub-polymer layers may be subsequently and repeatedly stacked one on another.

In an embodiment, each of the plurality of first polymer layers and the plurality of second polymer layers may have a refractive index in a range of about 1.3 to about 2.3.

According to an embodiment of the invention, a display panel includes: a light emitting element; and an encapsulation layer on the light emitting element, where the encapsulation layer covers the light emitting element. In such an embodiment, the encapsulation layer includes a plurality of polymer layers including a block copolymer. In such an embodiment, the plurality of polymer layers includes: a plurality of first polymer layers, each of which has a first refractive index; and a plurality of second polymer layers, each of which has a second refractive index different from the first refractive index, where the plurality of first polymer layers and the plurality of second polymer layers are alternately stacked one on another. In such an embodiment, a transmittance of light in a wavelength range of about 380 nm to about 420 nm in the encapsulation layer is about 10% or less.

According to an embodiment of the invention, a method of fabricating a display panel includes: preparing a light emitting element; and forming an encapsulation layer to cover the light emitting element. In such an embodiment, the forming the encapsulation layer includes: coating a coating solution including a block copolymer on the light emitting element to form a preliminary polymer layer; and allowing the block copolymer included in the preliminary polymer layer to be self-assembled to form a plurality of polymer layers. In such an embodiment, the plurality of polymer layers includes: a plurality of first polymer layers, each of which has a first refractive index; and a plurality of second polymer layers, each of which has a second refractive index greater than the first refractive index. In such an embodiment, a difference between the first refractive index and the second refractive index is in a range of about 0.1 to about 0.6.

In an embodiment, the block copolymer may include a first block monomer and a second block monomer different from the first block monomer. In such an embodiment, the allowing the block copolymer to be self-assembled may include: causing the first block monomer to form the plurality of first polymer layers; and causing the second block monomer to form the plurality of second polymer layers.

In an embodiment, the allowing the block copolymer to be self-assembled may include forming the plurality of first polymer layers and the plurality of second polymer layers to be alternately stacked with each other.

In an embodiment, the plurality of first polymer layers and the plurality of second polymer layers may be alternately stacked with each other in two or more layers.

In an embodiment, each of the plurality of first polymer layers may include a first sub-polymer layer and a second sub-polymer layer. Each of the plurality of second polymer layers may include a third sub-polymer layer and a fourth sub-polymer layer. In such an embodiment, each of the first, second, third, and fourth sub-polymer layers may be provided in plural, and the first, second, third, and fourth sub-polymer layers may be subsequently and repeatedly stacked one on another.

In an embodiment, a transmittance of light in a wavelength range of 380 nm to 420 nm in the encapsulation layer may be about 10% or less.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
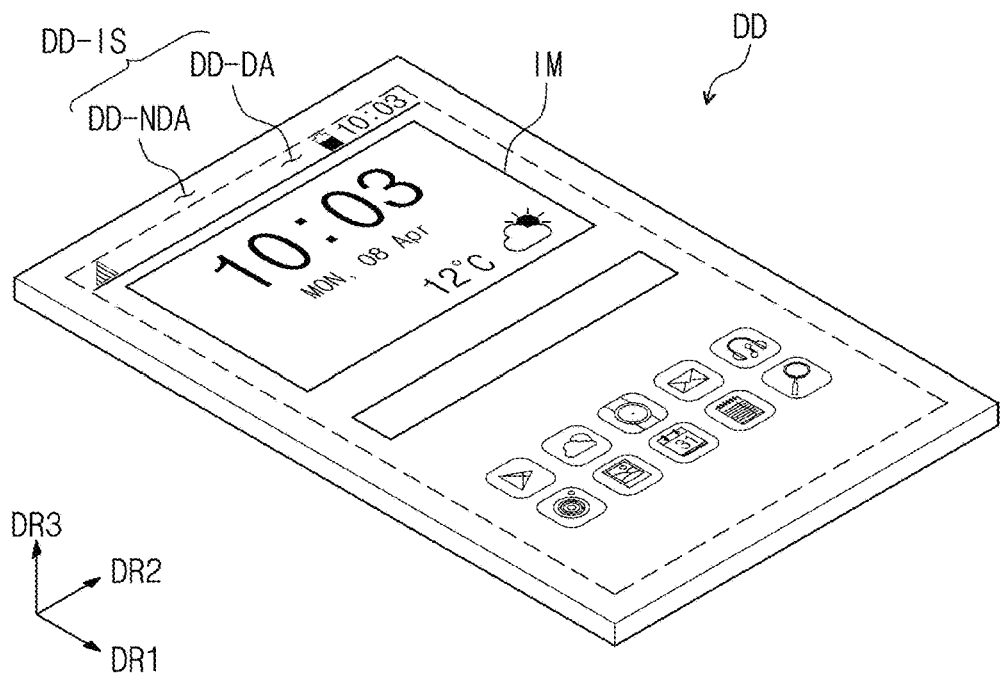
FIG. 1 illustrates a perspective view showing a display device according to an exemplary embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Herein, when an element (or region, layer, portion, etc.) is referred to as being "on", "connected to", or "coupled to" another element, it can be directly on, connected directly to or coupled direction to the other element or intervening elements may be present therebetween. In contrast, when an element is referred to as being "directly on", "connected directly to", or "coupled directly to" another element, there are no intervening elements present.

Like numerals indicate like components. Moreover, in the drawings, thicknesses, ratios, and dimensions of components are exaggerated for effectively explaining the technical contents.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various components, these components should not be limited by these terms. These terms are only used to distinguish one component from another component. For example, a first component could be termed a second component, and vice versa without departing from the scope of the invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
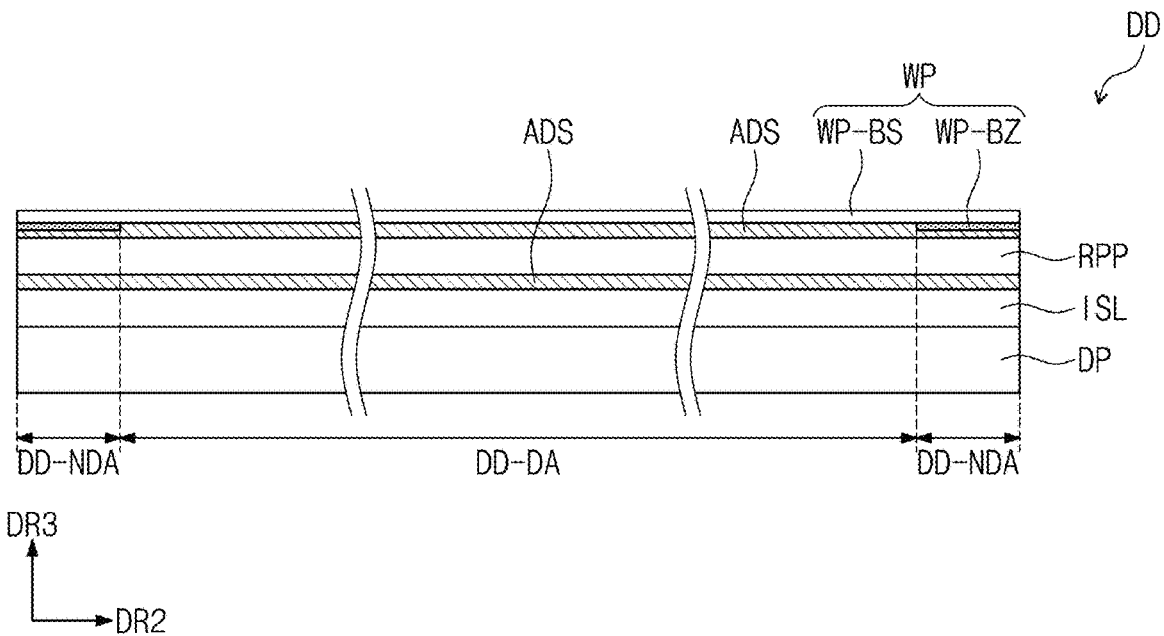
FIG. 2 illustrates a cross-sectional view showing a display device according to an exemplary embodiment of the invention.

FIG. 1 illustrates a perspective view showing a display device according to an exemplary embodiment of the invention. FIG. 2 illustrates a cross-sectional view showing a display device according to an exemplary embodiment of the invention.

In an embodiment, as shown in FIG. 1, a display device DD may display an image IM on a display surface DD-IS thereof. The display surface DD-IS may be parallel to a plane defined by a first direction DR1 and a second direction DR2. A third direction DR3 indicates a normal direction to the display surface DD-IS, or a thickness direction of the display device DD.

Herein, front and rear surfaces (or top and bottom surfaces) of each member or unit which will be discussed below are differentiated from each other based on the third direction DR3. The first, second, and third directions DR1, DR2, and DR3 illustrated herein, however, are mere exemplary without being limited thereto.

In an embodiment, as shown in FIG. 1, the display device DD may include a flat display surface, but the invention are not limited thereto. The display device DD may further include a curved display surface. The display device DD may include a cubic display surface. The cubic display surface may include a plurality of display areas (e.g., a polygonal pillar-shaped display surface) oriented in different directions.

In an embodiment, the display device DD may be a rigid display device. The invention, however, are not limited thereto, and alternatively, the display device DD may be a flexible display device. The flexible display device DD may include a foldable display device or a bendable display device, a portion of which is foldable or bendable.

In an embodiment, as shown in FIG. 1, the display device DD may be used for a cellular phone terminal. Although not shown, a mobile phone terminal may be configured to include the display device DD in a bracket/casing which accommodates a mainboard on which are installed electronic modules, a camera module, a power module, and the like. In an embodiment, the display device DD may be applicable not only to large-sized electronic devices such as television sets and monitors, but to small and medium-sized electronic devices such as tablet personal computers ("PC"s), automotive navigation systems, game consoles, and smart watches.

In an embodiment, as shown in FIG. 1, the display surface DD-IS may include an image area DD-DA on which the image IM is displayed and a bezel area DD-NDA adjacent to the image area DD-DA. The bezel area DD-NDA may be a region on which no image is displayed. In an embodiment, as shown in FIG. 1, the image IM may be icons.

In an embodiment, the image area DD-DA may have a substantially rectangular shape as illustrated in FIG. 1. The phrase "substantially rectangular shape" includes not only a rectangular shape in the mathematical sense, but a rectangular shape whose edge (or corner) is defined without a vertex but with a curved boundary.

The bezel area DD-NDA may surround the image area DD-DA. The invention, however, are not limited thereto, and alternative, the image and bezel areas DD-DA and DD-NDA may be designed to have different shapes from each other. The bezel area DD-NDA may be disposed on only one side of the image area DD-DA. The bezel area DD-NDA may not be externally exposed based on a combination shape of the display device DD with a component of other electronic device.

FIG. 2 shows a cross-section defined by the second and third directions DR2 and DR3. In FIG. 2, components of the display device DD are schematically illustrated for convenience of illustration and description of a stacked relationship therebetween.

In an embodiment, the display device DD may include a display panel DP, an input sensor ISL, an anti-reflector RPP, and a window WP. Components of one or more of the display panel DP, the input sensor ISL, the anti-reflector RPP, and the window WP may be formed in a successive process, or may be combined with each other through one or more adhesive members ADS. The adhesive member ADS may be a transparent adhesive, such as a pressure sensitive adhesive ("PSA") film, an optically clear adhesive ("OCA") film, an optically clear resin ("OCR"). Adhesive members discussed below may include an ordinary adhesive or the like. In an embodiment of the invention, the anti-reflector RPP and the window WP may be replaced with other components or omitted.

In an embodiment, among the input sensor ISL, the anti-reflector RPP and the window WP shown in FIG. 2, the input sensor ISL and the display panel DP may be formed in a successive process, such that the input sensor ISL may be directly disposed on the display panel DP. Herein, the phrase "a component A is directly disposed on a component B" means that neither an adhesive layer nor an adhesive member is disposed between the component A and the component B. After the component A is formed, the component A may be provided on its base surface with the component B that is formed in a successive process.

In an embodiment, the anti-reflector RPP and the window WP may be of a panel type, and the input sensor ISL may be of a layer type. The "panel type" may include a base layer that provides a base surface, for a synthetic resin film, a composite film, or a glass substrate, but the "layer type" may include no base layer. For example, a "layer type" component may be disposed on a base surface of other component. In an embodiment of the invention, the anti-reflector RPP and the window WP may be of the layer type.

The display panel DP may generate an image, and the input sensor ISL may obtain coordinate information of an external input (e.g., a touch event). Although not shown, an embodiment of the display device DD may further include a protective member disposed on a bottom surface of the display panel DP. The protective member and the display panel DP may be combined with each other through an adhesive member.

An embodiment of the display panel DP may be, but not especially limited to, an emissive type display panel, for example, an organic light emitting display panel or a quantum-dot light emitting display panel. Display panels may be classified based on a constituent material of a light emitting element. An emission layer of the organic light emitting display panel may include an organic light emitting material. An emission layer of the quantum-dot light emitting display panel may include a quantum-dot or a quantum-rod. Hereinafter, for convenience of description, embodiments where the display panel DP is an organic light emitting display panel will be described in detail, but not being limited thereto.

The anti-reflector RPP may reduce a reflectance of external light that is incident from an upper side of the window WP. In an embodiment, the anti-reflector RPP may include a retarder and a polarizer. The retarder may be of a film type or a liquid crystal coating type, and may include a λ/2 retarder or λ/4 retarder. The polarizer may also be of a film type or a liquid crystal coating type. The film type may include a stretchable synthetic resin film, and the liquid crystal coating type may include arrayed liquid crystals. The retarder and the polarizer may further include a protective film. Either the retarder and the polarizer or the protective film A may define a base layer of the anti-reflector RPP.

In an embodiment, the anti-reflector RPP may include color filters. The color filters may be arranged in a certain fashion. The arrangement of the color filters may be determined based on colors of light emitted from pixels included in the display panel DP. The anti-reflector RPP may further include black matrices adjacent to the color filters.

In an embodiment, the anti-reflector RPP may include a destructive-interference structure. In one embodiment, for example, the destructive-interference structure may include a first reflective layer and a second reflective layer that are disposed on different levels. A first reflection light and a second reflection light, which are respectively reflected from the first reflective layer and the second reflective layer, may interfere destructively with each other, and thus a reflectance of external light may be reduced.

In an embodiment, the window WP may include a base layer WP-BS and a light-shield pattern WP-BZ. The base layer WP-BS may include a glass substrate and/or a synthetic resin film. The base layer WP-BS may be a single layer, but not being limited thereto. Alternatively, the base layer WP-BS may include two or more films that are combined through an adhesive.

The light-shield pattern WP-BZ may partially overlap the base layer WP-BS. The light-shield pattern WP-BZ may be disposed on a bottom surface of the base layer WP-BS, and may substantially define the bezel area DD-NDA of the display device DD. A region where the light-shield pattern WP-BZ is not disposed may define the image area DD-DA of the display device DD. The window WP may include a light shield area that is defined by a region overlapping or covered by the light-shield pattern WP-BZ, and may also include a light transmission area that is defined by a region not overlapping or covered by the light-shield pattern WP-BZ is not disposed.

The light-shield pattern WP-BZ may have a multi-layered structure. The multi-layered structure may include a chromatic color layer and an achromatic light-shield layer (e.g., having a black color). The chromatic color layer and the achromatic light-shield layer may be formed by a deposition, a printing, or a coating. Although not shown, the window WP may further include a functional coating layer disposed on a front surface of the base layer WP-BS. The functional coating layer may include at least one layer selected from an anti-fingerprint layer, an anti-reflective layer, and a hard coating layer.

Figure 3:
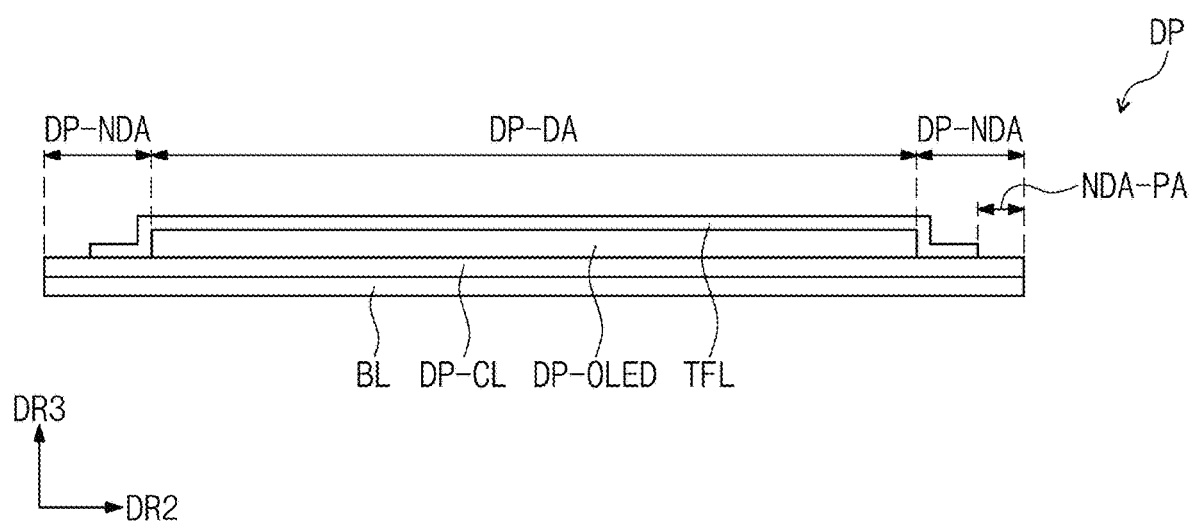
FIG. 3 illustrates a cross-sectional view showing a display panel according to an exemplary embodiment of the invention.
Figure 4A:
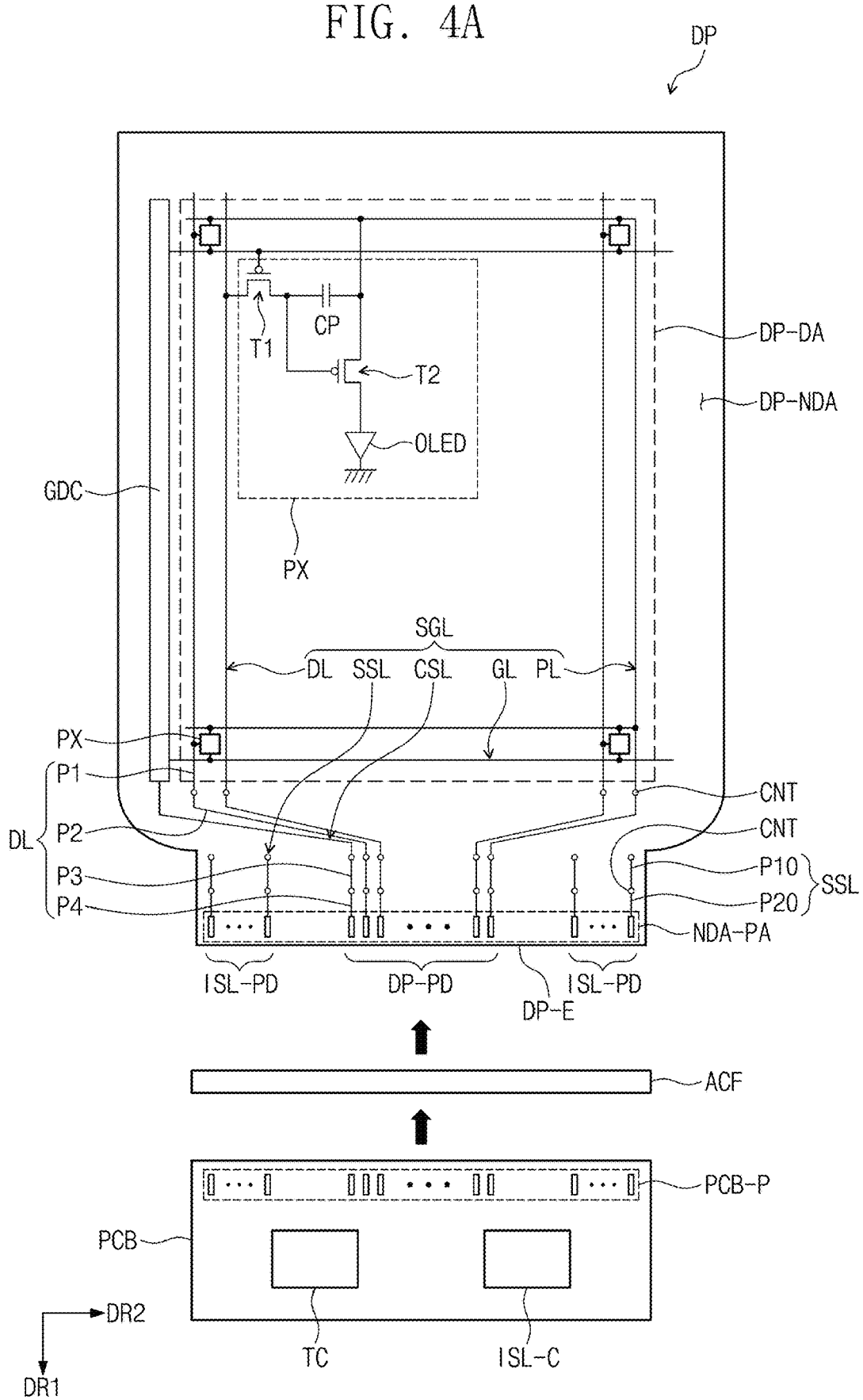
FIGS. 4A and 4B illustrate plan views showing a display panel according to an exemplary embodiment of the invention.
Figure 4B:
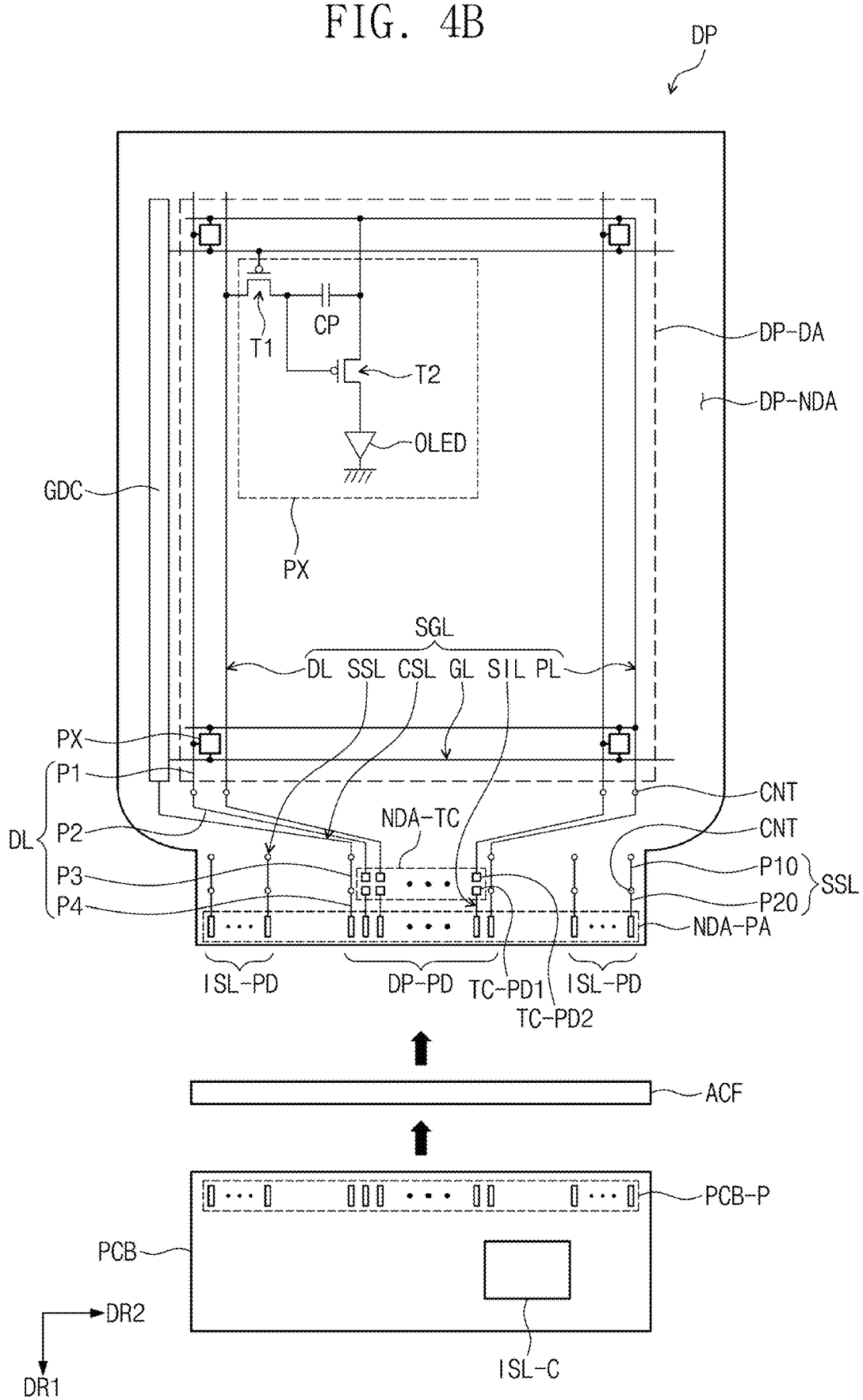

FIG. 3 illustrates a cross-sectional view showing a display panel according to an exemplary embodiment of the invention. FIGS. 4A and 4B illustrate plan views showing a display panel according to an exemplary embodiment of the invention.

In an embodiment, as shown in FIG. 3, the display panel DP may include a base layer BL on which are disposed a circuit layer DP-CL, a display element layer DP-OLED, and an upper dielectric layer TFL. The display panel DP may be defined with a display area DP-DA and a non-display area DP-NDA that respectively correspond to the image area DD-DA and the bezel area DD-NDA illustrated in FIG. 1. Herein, the phrase "a region/portion corresponds to other region/portion" indicates the meaning of "a region/portion overlaps other region/portion", and is not limited to the meaning of "a region/portion has a same area and/or shape as that of other region/portion."

The base layer BL may include a synthetic resin film. The base layer BL may include at least one selected from a glass substrate, a metal substrate, and an organic/inorganic composite substrate.

The circuit layer DP-CL may include a dielectric layer and a circuit element. The dielectric layer may include an inorganic layer and an organic layer. The circuit element may include signal lines and a pixel driver circuit.

The display element layer DP-OLED may include the light emitting element. The display element layer DP-OLED may include an organic light emitting diode as the light emitting element. The display element layer DP-OLED may further include an organic layer such as a pixel definition layer.

The upper dielectric layer TFL may include a plurality of thin layers. One or more of the thin layers may be disposed to increase optical efficiency, and other one or more of the thin layers may be disposed to protect light emitting elements. The upper dielectric layer TFL will be described in detail below.

In an embodiment, as shown in FIGS. 4A and 4B, the display panel DP may include a driver circuit GDC, a plurality of signal lines SGL, a plurality of signal pads DP-PD and ISL-PD, and a plurality of pixels PX.

The driver circuit GDC may include a scan driver circuit. The scan driver circuit may generate a plurality of scan signals, and sequentially output the scan signals to a plurality of scan lines GL which will be described in detail below. The scan driver circuit may further output various control signals to a driver circuit for driving the pixels PX.

The scan driver circuit may include a plurality of transistors formed by one of a low temperature polycrystalline silicon ("LTPS") process and a low temperature polycrystalline oxide ("LTPO") process that are the same as that used for forming the driver circuit for driving the pixels PX.

The signal lines SGL may include scan lines GL, data lines DL, a power line PL, and a control signal line CSL. Each of the scan lines GL may be connected to a corresponding one of the pixels PX, and each of the data lines DL may be connected to a corresponding one of the pixels PX. The power line PL may be connected to the pixels PX. The control signal line CSL may provide the scan driver circuit with control signals.

In an embodiment, the signal lines SGL may further include subsidiary lines SSL. The subsidiary lines SSL may be signal lines connected to the input sensor (see ISL of FIG. 2). In an alternative embodiment of the invention, the subsidiary lines SSL may be omitted.

The signal lines SGL may include a plurality of segments located at different levels. FIG. 4A shows an embodiment where each of the data lines DL is divided into four segments P1 to P4 and each of the subsidiary lines SSL is divided into two segments P10 and P20. The four segments P1 to P4 of each of the data lines may be connected to each other through contact holes CNT, and the two segments P10 and P20 of each of the subsidiary lines may be connected to each other through contact holes CNT. The first segment P10 of a subsidiary line SSL may be connected through the contact hole CNT to a signal line of the input sensor (see ISL of FIG. 2).

The signal pads DP-PD and ISL-PD may include first-type signal pads DP-PD that are connected to the data lines DL, the power line PL, and the control signal line CSL, and also include second-type signal pads ISL-PD that are connected to the subsidiary lines SSL. The first-type signal pads DP-PD and the second-type signal pads ISL-PD may be disposed adjacent to each other on a pad area NDA-PA that is defined on a portion of the non-display area DP-NDA. The pad area NDA-PA may be adjacent to an edge DP-E of the display panel DP. The signal pads DP-PD and ISL-PD may be formed in the same process, such that stacking structures or constituent materials of the signal pads DP-PD and ISL-PD may not be differentiated from each other.

The display area DP-DA may be defined by a region where the pixels PX are disposed. A plurality of electronic elements may be disposed on the display area DP-DA. The electronic elements may include a light emitting element and a pixel driver circuit connected to the light emitting element, which are disposed on each of the pixels PX. The circuit layer DP-CL shown in FIG. 3 may include the driver circuit GDC, the signal lines SGL, the signal pads DP-PD and ISL-PD, and the pixel driver circuit.

The pixel PX may include, for example, a first transistor T1, a second transistor T2, a capacitor CP, and a light emitting element OLED. In an embodiment, the pixel driver circuit may include only a switching transistor and a driver transistor, as shown in FIG. 4A, but the invention are not limited thereto. The first transistor T1 may be connected to the scan line GL and the data line DL. The light emitting element OLED may receive a power voltage provided from the power line PL.

FIG. 4A further shows a circuit board PCB electrically connected to the display panel DP. The circuit board PCB may be a rigid circuit board or a flexible circuit board.

The circuit board PCB may be provided thereon with a timing control circuit TC that controls an operation of the display panel DP. The circuit board PCB may also be provided thereon with an input sensing circuit ISL-C that controls the input sensor ISL. Each of the timing control circuit TC and the input sensing circuit ISL-C may be mounted in a form of an integrated chip on the circuit board PCB. In an embodiment of the invention, the timing control circuit TC and the input sensing circuit ISL-C may be mounted in a form of a single integrated chip on the circuit board PCB. The circuit board PCB may include circuit board pads PCB-P electrically connected to the signal pads DP-PD and ISL-PD. Although not shown, the circuit board PCB may further include signal lines that connect the circuit board pads PCB-P to the timing control circuit TC and/or the input sensing circuit ISL-C. In such an embodiment, the circuit board pads PCB-P may be output pads, and the circuit board PCB may further include input pads.

Conductive members such as anisotropic conductive films ACF may be used to electrically connect the signal pads DP-PD and ISL-PD of the display panel DP to the circuit board pads PCB-P. In an embodiment, the anisotropic conductive films ACF may be replaced with conductive balls.

In an alternative embodiment, as shown in FIG. 4B, the display panel DP may further include a chip mount area NDA-TC disposed on the non-display area DP-NDA. In such an embodiment, a chip-type timing control circuit (see TC of FIG. 4A) may be mounted on the chip mount area NDA-TC.

First chip pads TC-PD1 and second chip pads TC-PD2 may be disposed on the chip mount area NDA-TC. The first chip pads TC-PD1 may be connected to the data lines DL, and the second chip pads TC-PD2 may be connected to the first-type signal pads DP-PD through input signal lines SIL. Terminals of the timing control circuit TC may be connected to the first chip pads TC-PD1 and the second chip pads TC-PD2. Accordingly, the data lines DL may be electrically connected through the timing control circuit TC to the signal pads DP-PD. In an embodiment of the invention, one or more of the control signal line CSL and the power line PL may be connected to the timing control circuit TC.

In an embodiment, the display panel DP shown in FIG. 4A or 4B may be bent at a portion thereof. A portion of the non-display area DP-NDA may be bent along a bending axis parallel to the second direction DR2. The bending axis may be defined to overlap the third segments P3 of the data lines DL and the first segments P10 of the subsidiary lines SSL.

Figure 5A:
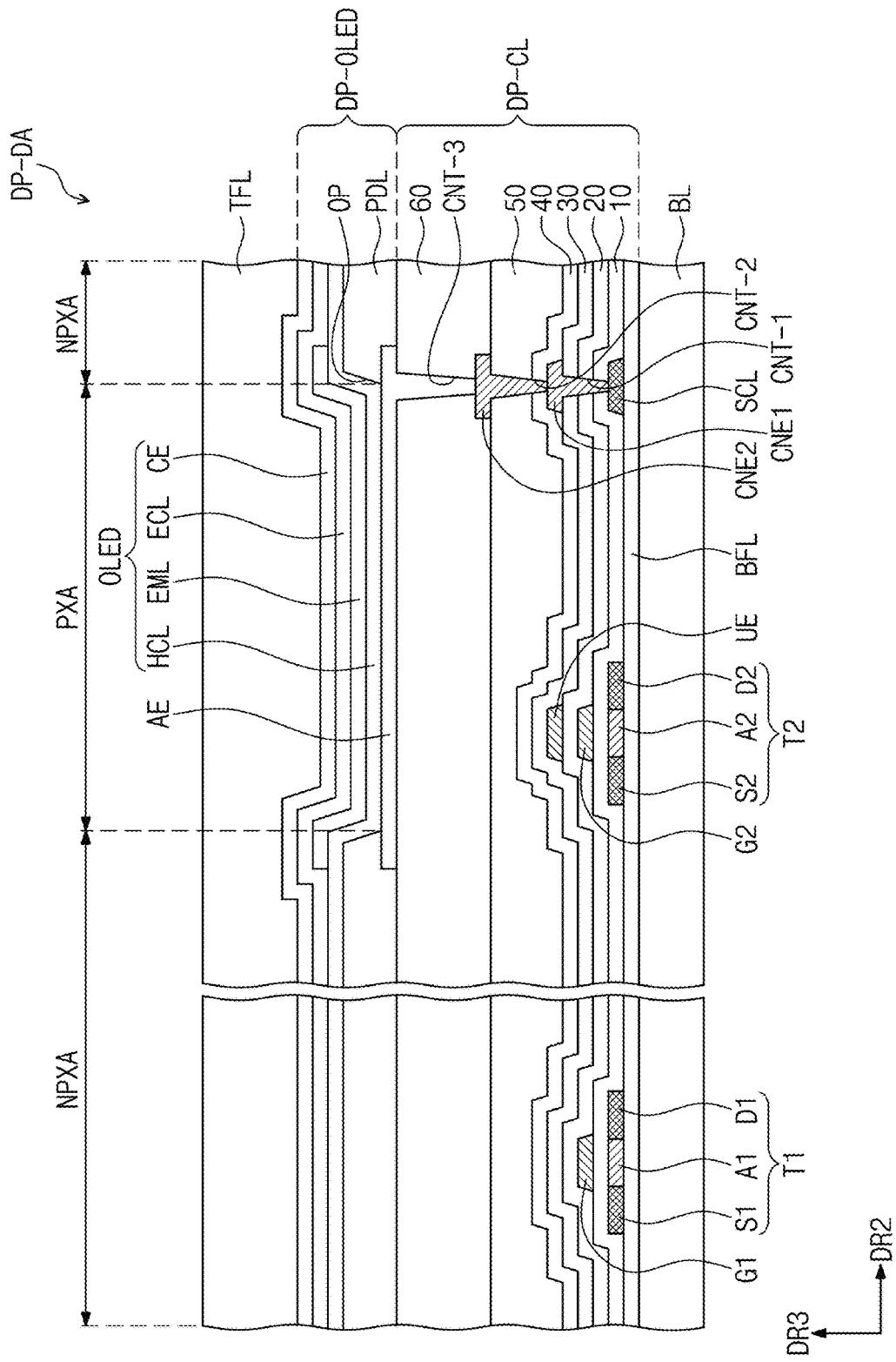
FIG. 5A illustrates an enlarged cross-sectional view showing a display panel according to an exemplary embodiment of the invention.
Figure 5B:
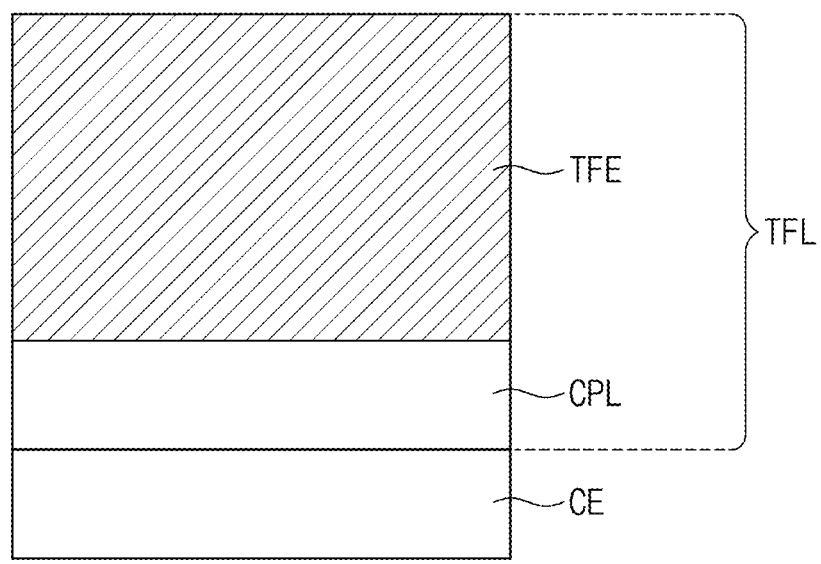
FIG. 5B illustrates an enlarged cross-sectional view showing components of a display panel according to an exemplary embodiment of the invention.

FIG. 5A illustrates an enlarged cross-sectional view showing a display panel according to an exemplary embodiment of the invention. FIG. 5B illustrates an enlarged cross-sectional view showing an upper dielectric layer according to an exemplary embodiment of the invention.

Referring to FIG. 5A, an embodiment of the display panel DP may include a plurality of dielectric layers, a semiconductor pattern, a conductive pattern, and a signal line. In an embodiment, the dielectric layer, the semiconductor layer, and the conductive layers may be formed by a coating or a deposition, and the dielectric layer, the semiconductor layer and the conductive layers may be selectively patterned by a photolithography. In such an embodiment, the semiconductor pattern, the conductive pattern and the signal line that are included in the circuit layer DP-CL and the display element layer DP-OLED may be formed through the processes described above.

The base layer BL may include a synthetic resin film. The synthetic resin film may include a thermosetting resin. The base layer BL may have a multi-layered structure. In one embodiment, for example, the base layer BL may have a triple-layered structure including a synthetic resin layer, an adhesive layer, and a synthetic resin layer. The synthetic resin layer may be a polyimide-based resin layer, but a material of the synthetic resin layer is not especially limited. The synthetic resin layer may include at least one material selected from acryl-based resin, methacryl-based resin, polyisoprene, vinyl-based resin, epoxy-based resin, urethane-based resin, cellulose-based resin, siloxane-based resin, polyamide-based resin, and perylene-based resin. The base layer BL may include at least one selected from a glass substrate, a metal substrate, and an organic/inorganic composite substrate.

In an embodiment, an inorganic layer may be disposed or formed on a top surface of the base layer BL. The inorganic layer may include at least one material selected from aluminum oxide, titanium oxide, silicon oxide, silicon oxynitride, zirconium oxide, and hafnium oxide. The inorganic layer may be formed to have a multi-layer structure. The inorganic layer having the multi-layer structure may constitute a barrier layer and/or a buffer layer. In an embodiment, the display panel DP includes a buffer layer BFL as shown in FIG. 5A.

The buffer layer BFL may increase a bonding force between the base layer BL and a semiconductor pattern. The buffer layer BFL may include a silicon oxide layers and a silicon nitride layer. The silicon oxide layer and the silicon nitride layer may be alternately stacked one on another.

A semiconductor pattern may be disposed on the buffer layer BFL. The semiconductor pattern may include a polysilicon. The invention, however, are not limited thereto, and alternatively, the semiconductor pattern may include an amorphous silicon or a metal oxide.

FIG. 5A shows only a portion of the semiconductor pattern, and when viewed in a plan view, the semiconductor pattern may further be disposed on other regions of the pixel PX. The semiconductor pattern may be regularly arranged over the pixels PX. The semiconductor pattern may have an electrical property that is determined based on whether the semiconductor pattern is doped or not. The semiconductor pattern may include a doped region and an undoped region. The doped region may be doped with an n-type or p-type dopant. A p-type transistor may include an doped region doped with an p-type dopant.

The doped region may have a greater conductance than that of the undoped region, and may substantially serve as an electrode or a signal line. The undoped region may substantially correspond to an active (or channel) of a transistor. In one embodiment, for example, a portion of the semiconductor pattern may be an active of a transistor, another portion of the semiconductor pattern may be a source or drain of the transistor, and still another portion of the semiconductor pattern may be a connection electrode or a connection signal line.

In an embodiment, as shown in FIG. 5A, the first transistor T1 may include a source S1, an active A1, and a drain D1 that are formed from the semiconductor pattern, and the second transistor T2 may include a source S2, an active A2, and a drain D2 that are formed from the semiconductor pattern. When viewed in a cross-sectional view, the source S1 and the drain D1 may extend in opposite directions from the active A2, and likewise, the source S2 and the drain D2 may extend in opposite directions from the active A2. FIG. 5A shows a portion of a connection signal line SCL that is formed from the semiconductor pattern. Although not shown, when viewed in a plan view, the connection signal line SCL may be connected to the drain D2 of the second transistor T2.

A first dielectric layer 10 may be disposed on the buffer layer BFL. The first dielectric layer 10 may commonly overlap a plurality of pixels (see PX of FIGS. 4A and 4B) and covers the semiconductor pattern. The first dielectric layer 10 may be an inorganic layer and/or an organic layer, and may have a single-layered or multi-layered structure. The first dielectric layer 10 may include at least one material selected from aluminum oxide, titanium oxide, silicon oxide, silicon oxynitride, zirconium oxide, and hafnium oxide. In an embodiment, the first dielectric layer 10 may be a single-layered silicon oxide layer. In an embodiment, the first dielectric layer 10, a dielectric layer of the circuit layer DP-CL may be an inorganic layer and/or an organic layer, and may have a single-layered or multi-layered structure. The inorganic layer may include at least one material selected from the materials mentioned above.

Gates G1 and G2 may be disposed on the first dielectric layer 10. Each of the gates G1 and G2 may be a portion of a metal pattern. The gates G1 and G2 may correspondingly overlap the actives A1 and A2. The gates G1 and G2 may serve as a mask in a process where the semiconductor pattern is doped.

The first dielectric layer 10 may be provided thereon with a second dielectric layer 20 that covers the gates G1 and G2. The second dielectric layer 20 may commonly overlap the pixels (see PX of FIGS. 4A and 4B). The second dielectric layer 20 may be an inorganic layer and/or an organic layer, and may have a single-layered or multi-layered structure. In an embodiment, the second dielectric layer 20 may be a single-layered silicon oxide layer.

An upper electrode UE may be disposed on the second dielectric layer 20. The upper electrode UE may overlap the gate G2 of the second transistor T2. The upper electrode UE may be defined by a portion of a metal pattern. The capacitor (see CP of FIG. 4A) may be defined by a portion of the gate G2 and the upper electrode UE that overlaps the portion of the gate G2. In an embodiment of the invention, the upper electrode UE may be omitted.

The second dielectric layer 20 may be provided thereon with a third dielectric layer 30 that covers the upper electrode UE. In the embodiment, the third dielectric layer 30 may be a single-layered silicon oxide layer. A first connection electrode CNE1 may be disposed on the third dielectric layer 30. The first connection electrode CNE1 may be coupled to the connection signal line SCL through a contact hole CNT-1 defined through the first, second, and third dielectric layers 10, 20, and 30.

The third dielectric layer 30 may be provided thereon with a fourth dielectric layer 40 that covers the first connection electrode CNE1. The fourth dielectric layer 40 may be a single-layered silicon oxide layer. A fifth dielectric layer 50 may be disposed on the fourth dielectric layer 40. The fifth dielectric layer 50 may be an organic layer. A second connection electrode CNE2 may be disposed on the fifth dielectric layer 50. The second connection electrode CNE2 may be coupled to the first connection electrode CNE1 through a contact hole CNT-2 defined through the fourth and fifth dielectric layers 40 and 50.

The fifth dielectric layer 50 may be provided thereon with a sixth dielectric layer 60 that covers the second connection electrode CNE2. The sixth dielectric layer 60 may be an organic layer. A first electrode AE may be disposed on the sixth dielectric layer 60. The first electrode AE may be connected to the second connection electrode CNE2 through a contact hole CNT-3 defined through the sixth dielectric layer 60. An opening OP may be defined in the pixel definition layer PDL. The opening OP of the pixel definition layer PDL may expose at least a portion of the first electrode AE.

In an embodiment, as shown in FIG. 5A, the display area DP-DA may include an emission area PXA and a non-emission area NPXA adjacent to the emission area PXA. The non-emission area NPXA may surround the emission area PXA. In an embodiment, the emission area PXA may be defined to correspond to a portion of the first electrode AE, which portion is exposed to the opening OP.

A hole control layer HCL may be disposed in common on the emission area PXA and the non-emission area NPXA. The hole control layer HCL may include a hole transport layer, and further include a hole injection layer. An emission layer EML may be disposed on the hole control layer HCL. The emission layer EML may be disposed on a region that corresponds to the opening OP. In one embodiment, for example, the emission layer EML may be provided or formed on each of the pixels (see PX of FIG. 4A).

An electron control layer ECL may be disposed on the emission layer EML. The electron control layer ECL may include an electron transport layer, and further include an electron injection layer. In an embodiment, the hole control layer HCL and the electron control layer ECL are formed in common on a plurality of pixels (see PX of FIG. 4A) using an open mask. A second electrode CE may be disposed on the electron control layer ECL. The second electrode CE may have a unitary shape that is disposed in common on a plurality of pixels (see PX of FIG. 4A).

In an embodiment, as shown in FIGS. 5A and 5B, the upper dielectric layer TFL may be disposed on the second electrode CE. The upper dielectric layer TFL may include a plurality of thin layers. In an embodiment, the upper dielectric layer TFL may include a capping layer CPL and an encapsulation layer TFE. The encapsulation layer TFE may include a plurality of polymer layers. The polymer layers included in the encapsulation layer TFE will described in greater detail below.

In an embodiment, as shown in FIG. 5B, the capping layer CPL may be disposed on and in contact with the second electrode CE. The capping layer CPL may include an organic material. The capping layer CPL may protect the second electrode CE from a subsequent process such as a sputtering process, and may increase light emission efficiency of the light emitting element OLED. The capping layer CPL may have a refractive index greater than that of the plurality of thin layers included in the encapsulation layer TFE.

In an embodiment of the invention, the capping layer CPL and the encapsulation layer TFE may be provided therebetween with an inorganic layer, for example, a lithium fluoride (LiF) layer. The lithium fluoride layer may increase light emission efficiency of the light emitting element OLED.

FIGS. 6A to 6D illustrate simplified cross-sectional views showing some component of a display panel according to an exemplary embodiment of the invention. FIGS. 6A to 6D show an upper dielectric layer structure in which the encapsulation layer TFE is disposed on the capping layer CPL.

Figure 6A:
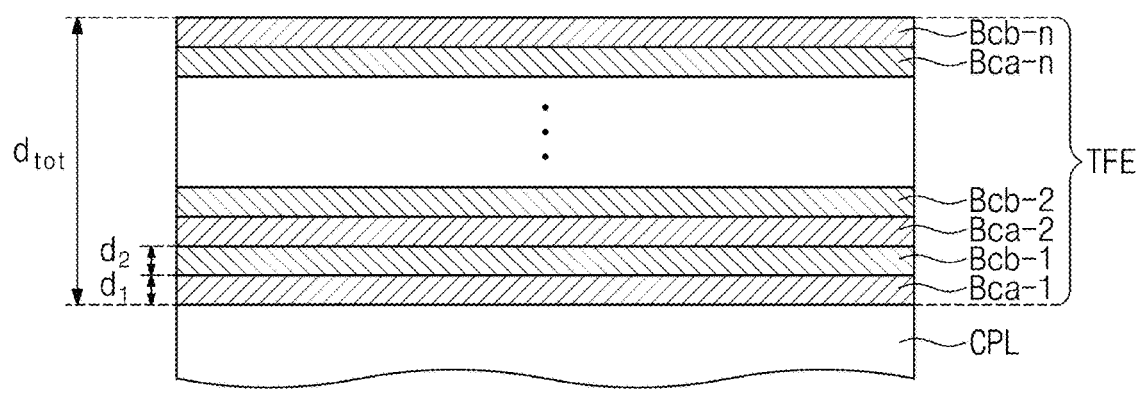
FIGS. 6A to 6D illustrate cross-sectional views showing component of a display panel according to an exemplary embodiment of the invention.

Referring to FIG. 6A, in an embodiment, the encapsulation layer TFE may include a plurality of polymer layers. The plurality of polymer layers may include a plurality of first polymer layers Bca-1, Bca-2, . . . , and Bca-n and a plurality of second polymer layers Bcb-1, Bcb-2, . . . , and Bcb-n.

Each of the plurality of first polymer layers Bca-1, Bca-2, . . . , and Bca-n may have a first refractive index. Each of the plurality of second polymer layers Bcb-1, Bcb-2, . . . , and Bcb-n may have a second refractive index different from the first refractive index. The second refractive index may be greater than the first refractive index. The difference in refractive index between the plurality of the first polymer layers Bca-1, Bca-2, . . . , and Bca-n and the plurality of second polymer layers Bcb-1, Bcb-2, . . . , and Bcb-n may be in a range of about 0.1 to about 0.6. The difference between the first refractive index and the second refractive index is in a range of 0.1 to 0.6. In an embodiment, the difference in refractive index between the plurality of the first polymer layers Bca-1, Bca-2, . . . , and Bca-n and the plurality of second polymer layers Bcb-1, Bcb-2, . . . , and Bcb-n may be in a range of about 0.2 to about 0.4. The difference in refractive index between the plurality of the first polymer layers Bca-1, Bca-2, . . . , and Bca-n and the plurality of second polymer layers Bcb-1, Bcb-2, . . . , and Bcb-n may be selected to be a predetermined value to adjust a wavelength band and a reflection ratio of light to be blocked by the encapsulation layer TFE.

A refractive index of each of the plurality of the first polymer layers Bca-1, Bca-2, . . . , and Bca-n may be in a range of about 1.3 to about 2.3 and a refractive index of each of the plurality of second polymer layers Bcb-1, Bcb-2, . . . , and Bcb-n may be in a range of about 1.3 to about 2.3. In an embodiment, each of the plurality of the first polymer layers Bca-1, Bca-2, . . . , and Bca-n may have a first refractive index of about 1.5, and each of the plurality of second polymer layers Bcb-1, Bcb-2, . . . , and Bcb-n may have a second refractive index of about 1.7.

The plurality of first polymer layers Bca-1, Bca-2, . . . , and Bca-n may be stacked alternately with the plurality of second polymer layers Bcb-1, Bcb-2, . . . , and Bcb-n. In one embodiment, for example, the plurality of second polymer layers Bcb-1, Bcb-2, . . . , and Bcb-n may be sequentially stacked between the plurality of first polymer layers Bca-1, Bca-2, . . . , and Bca-n, and the plurality of first polymer layers Bca-1, Bca-2, . . . , and Bca-n may be sequentially stacked between the plurality of second polymer layers Bcb-1, Bcb-2, . . . , and Bcb-n.

A plurality of polymer layers may include a block copolymer. The block copolymer means a material in which are combined two or more polymers having chemically different bonds from each other, or a unique polymer in which two or more kinds of copolymer chains are forcibly connected through chemical bonds. The block copolymer may form to have a uniformly arranged self-assembled structures that have spherical, cylindrical, pillar, or lamellar shapes with sizes of tens of nanometers. In an embodiment, the block copolymer may have a lamellar-shaped self-assemble structure.

The block copolymer may include a first block monomer and a second block monomer different from the first block monomer. Each of the plurality of first polymer layers Bca-1, Bca-2, . . . , and Bca-n may include the first block monomer, and each of the plurality of second polymer layers Bcb-1, Bcb-2, . . . , and Bcb-n may include the second block monomer. Each of the plurality of first polymer layers Bca-1, Bca-2, . . . , and Bca-n may be defined by a portion including the first block monomer of the block copolymer, and each of the plurality of second polymer layers Bcb-1, Bcb-2, . . . , and Bcb-n may be defined by a portion including the second block monomer of the block copolymer. The block copolymer may be self-assembled to form each of the plurality of first polymer layers Bca-1, Bca-2, . . . , and Bca-n and each of the plurality of second polymer layers Bcb-1, Bcb-2, . . . , and Bcb-n. The first block monomer included in the block copolymer may form the plurality of first polymer layers Bca-1, Bca-2, . . . , and Bca-n, and the second block monomer included in the block copolymer may form the plurality of second polymer layers Bcb-1, Bcb-2, . . . , and Bcb-n.

Each of the first and second block monomers may include at least one material selected from polystyrene, polymethylmethacrylate, polyethylene oxide, polydimethylsiloxane, fluorohexylethylacrylate, inorganic polymers, and inorganic nano-particles. In an embodiment, the block copolymer include polystyrene and polymethylmethacrylate that are connected to each other. The invention, however, are not limited thereto, and alternatively, the block copolymer may include at least one material selected from various organic polymers, inorganic polymers, and inorganic nano-particles.

A thickness $d_1$ of each of the plurality of first polymer layers Bca-1, Bca-2, . . . , Bca-n may be in a range of about 30 nanometers (nm) to about 90 nm, and a thickness $d_2$ of each of the plurality of second polymer layers Bcb-1, Bcb-2, . . . , and Bcb-n may be in a range of about 30 nm to about 90 nm. The thicknesses $d_1$ and $d_2$ may be determined based on molecular structures and molecular weights of the block copolymers included in the plurality of first polymer layers Bca-1, Bca-2, . . . , and Bca-n and the plurality of second polymer layers Bcb-1, Bcb-2, . . . , and Bcb-n. In an embodiment, the first and second block monomers may be connected to each other to form the block copolymer, the thickness $d_1$ of each of the plurality of first polymer layers Bca-1, Bca-2, . . . , and Bca-n may be determined based on a molecular structure and a molecular weight of the first block monomer, and the thickness $d_2$ of each of the plurality of second polymer layers Bcb-1, Bcb-2, . . . , and Bcb-n may be determined on a molecular structure and a molecular weight of the second block monomer. The thicknesses $d_1$ and $d_2$ of the plurality of the first polymer layers Bca-1, Bca-2, . . . , and Bca-n and the plurality of second polymer layers Bcb-1, Bcb-2, . . . , and Bcb-n may be selected to be a predetermined value to adjust a peak wavelength of light to be blocked by the encapsulation layer TFE.

A pair may be formed by one (e.g., Bca-1) of the plurality of first polymer layers Bca-1, Bca-2, . . . , and Bca-n and a neighboring one (e.g., Bcb-1) of the plurality of second polymer layers Bcb-1, Bcb-2, . . . , and Bcb-n, and two or more pairs of the first and second polymer layers may be alternately and repeatedly stacked with each other. In an embodiment, as shown in FIG. 6A, n first polymer layers Bca-1, Bca-2, . . . , and Bca-n may be stacked alternately with n second polymer layers Bca-1, Bca-2, . . . , and Bca-n, where n is an integer equal to or greater than 2. In an embodiment, n may be 10. The stack number n of the plurality of the first polymer layers Bca-1, Bca-2, . . . , and Bca-n and the stack number n of the plurality of second polymer layers Bcb-1, Bcb-2, . . . , and Bcb-n may be selected to be a predetermined value to adjust a reflection ratio of light to be blocked by the encapsulation layer TFE. The stack number n of the plurality of the first polymer layers Bca-1, Bca-2, . . . , and Bca-n and of the plurality of second polymer layers Bcb-1, Bcb-2, . . . , and Bcb-n may be selected to be a predetermined value, in consideration of a total thickness $d_{tot}$ of the encapsulation layer TFE. In an embodiment, the total thickness $d_{tot}$ of the encapsulation layer TFE may be in a range of about 0.5 micrometer (μm) to about 5 μm.

In an embodiment of the invention, where the encapsulation layer TFE includes a plurality of polymer layers, a transmittance of light in a wavelength range of about 380 nm to about 420 nm in the encapsulation layer TFE may be about 10% or less. In one embodiment, for example, the encapsulation layer TFE may block light in a wavelength range of about 380 nm to about 420 nm. In such an embodiment, where the encapsulation layer TFE includes the plurality of first polymer layers Bca-1, Bca-2, . . . , and Bca-n and the plurality of second polymer layers Bcb-1, Bcb-2, . . . , and Bcb-2 whose refractive indices are different from those of the plurality of first polymer layers Bca-1, Bca-2, . . . , and Bca-n, light in a wavelength range of about 380 nm to about 420 nm may be reflected from interfaces between the plurality of first polymer layers Bca-1, Bca-2, . . . , and Bca-n and the plurality of second polymer layers Bcb-1, Bcb-2, . . . , and Bcb-2, such that the encapsulation layer TFE may effectively block the light in the wavelength range of about 380 nm to about 420 nm.

In an embodiment of a display panel, the encapsulation layer TFE may include a plurality of polymer layers, which polymer layers may include the plurality of first polymer layers Bca-1, Bca-2, . . . , and Bca-n and the plurality of second polymer layers Bcb-1, Bcb-2, . . . , and Bcb-n whose refractive indices are different from those of the plurality of first polymer layers Bca-1, Bca-2, and Bca-n, such that the encapsulation layer TFE may effectively block light of ultraviolet and near-ultraviolet ranges. In such an embodiment, a molecular structure and a molecular weight of the block copolymer included in a plurality of polymer layers may be adjusted in a way such that a difference in refractive index between the plurality of first polymer layers Bca-1, Bca-2, . . . , and Bca-n and the plurality of second polymer layers Bcb-1, Bcb-2, and Bcb-n may be adjusted to be in a range of about 0.1 to about 0.6 and each of the plurality of first polymer layers Bca-1, Bca-2, . . . , and Bca-n and the plurality of second polymer layers Bcb-1, Bcb-2, and Bcb-n may be adjusted to have a thickness in a range of about 30 nm to about 90 nm, and therefore light of ultraviolet and near-ultraviolet ranges may be effectively blocked. Accordingly, light of ultraviolet and near-ultraviolet ranges may be effectively prevented from penetrating through the encapsulation layer TFE into a light emitting element therebelow such that damage to the light emitting element and reduction in luminous efficiency and lifespan of the light emitting element may be effectively prevented.

Figure 6B:
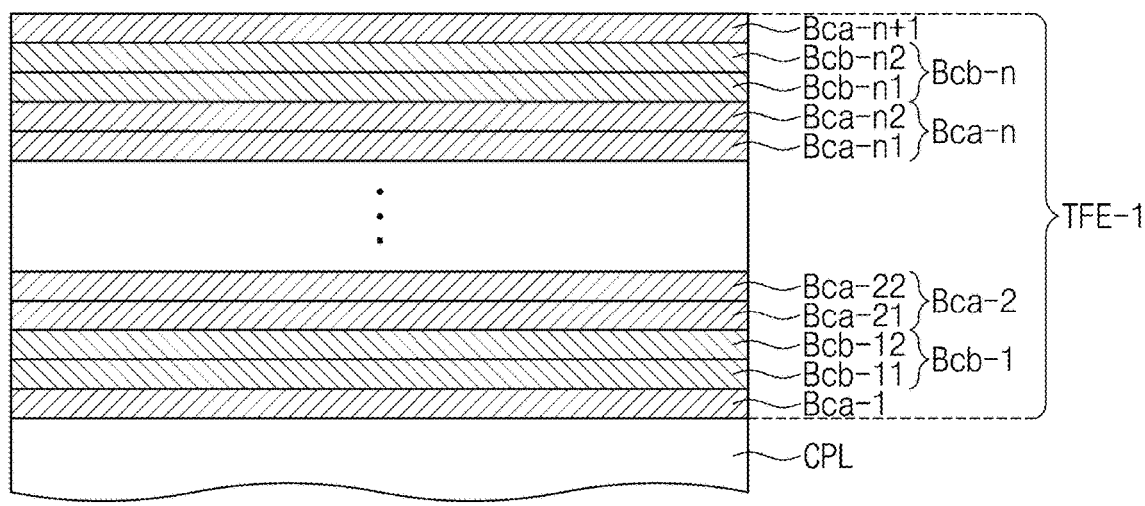

Referring to FIG. 6B, in an embodiment, an encapsulation layer TFE-1 may include sub-polymer layers included in at least one of the plurality of first polymer layers Bca-1, Bca-2, . . . , and Bca-n and in at least one of the plurality of second polymer layers Bcb-1, Bcb-2, . . . , and Bcb-n. Each of the at least one of the plurality of first polymer layers Bca-1, Bca-2, . . . , and Bca-n may include a first sub-polymer layer Bca-21, . . . , or Bca-n1 and a second sub-polymer layer Bca-22, . . . , or Bca-n2. Each of the at least one of the plurality of second polymer layers Bcb-1, Bcb-2, . . . , and Bcb-n may include a third sub-polymer layer Bcb-11, Bcb-21, . . . , or Bcb-n1 and a fourth sub-polymer layer Bcb-12, Bcb-22, . . . , or Bcb-n2. The first sub-polymer layer Bca-21, . . . , or Bca-n1, the second sub-polymer layer Bca-22, . . . , or Bca-n2, the third sub-polymer layer Bcb-11, Bcb-21, . . . , or Bcb-n1, and the fourth sub-polymer layer Bcb-12, Bcb-22, . . . , or Bcb-n2 may each be provided plural, and the first to fourth sub-polymer layers may be sequentially and repeatedly stacked one on another. In an embodiment, as shown in FIG. 6B, lowermost and uppermost first polymer layers Bca-1 and Bca-n+1 of the plurality of first polymer layers Bca-1, Bca-2, . . . , and Bca-n may each be provided in a form of a single layer, and remaining first polymer layers may each be provided in a form of a multiple layer including the first and second sub-polymer layers.

In an embodiment, the encapsulation layer TFE-1 may include a plurality of polymer layers including a block copolymer in which a first block monomer is connected to a second block monomer, and the block copolymer may be self-assembled to form the plurality of first polymer layers Bca-1, Bca-2, . . . , and Bca-n and the plurality of second polymer layers Bcb-1, Bcb-2, . . . , and Bcb-n. Therefore, during the self-assembly step, a molecular interaction may cause the first and second block monomers to align with each other to form the encapsulation layer TFE-1 having a structure in which are sequentially and repeatedly stacked the first sub-polymer layer Bca-21, . . . , or Bca-n1, the second sub-polymer layer Bcb-11, Bcb-21, . . . , or Bcb-n1, the third sub-polymer layer Bcb-21, or Bcb-n1, and the fourth sub-polymer layer Bcb-12, Bcb-22, . . . , or Bcb-n2.

Figure 6C:
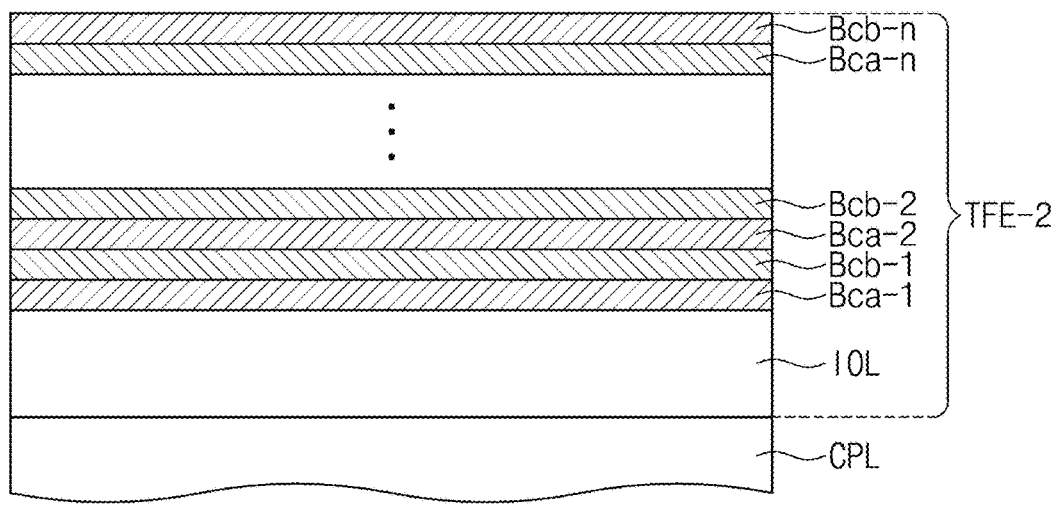

Referring to FIG. 6C, in an embodiment, an encapsulation layer TFE-2 may further include an inorganic encapsulation layer IOL disposed between the light emitting element and a plurality of polymer layers. The inorganic encapsulation layer IOL may be disposed on the capping layer CPL, which is disposed on the light emitting element. The inorganic encapsulation layer IOL may be disposed directly on the capping layer CPL, and a lowermost polymer layer Bca-1 of the plurality of polymer layers may be disposed directly on the inorganic encapsulation layer IOL.

The inorganic encapsulation layer IOL may protect the display element layer (see DP-OLED of FIG. 5A) from moisture/oxygen. The inorganic encapsulation layer IOL may be one of a silicon nitride layer, a silicon oxynitride layer, and a silicon oxide layer. The inorganic encapsulation layer IOL may be one of a titanium oxide layer or an aluminum oxide layer.

Figure 6D:
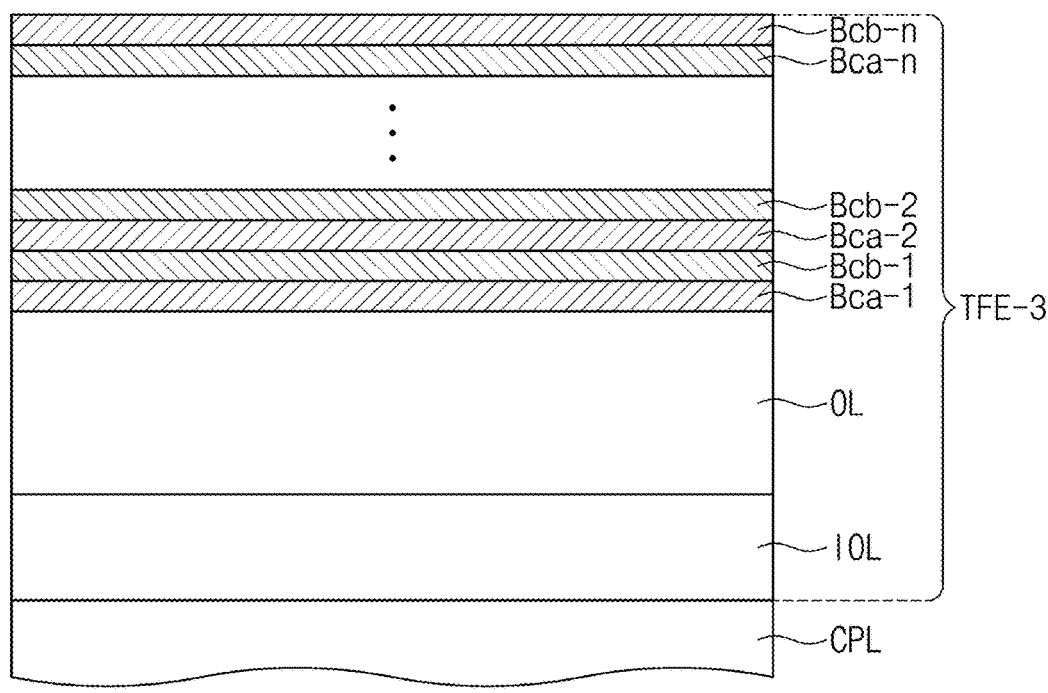

Referring to FIG. 6D, in an embodiment, an encapsulation layer TFE-3 may further include an inorganic encapsulation layer IOL and an organic encapsulation layer OL that are disposed between the light emitting element and a plurality of polymer layers. The inorganic encapsulation layer IOL may be disposed on the capping layer CPL, which is disposed on the light emitting element, and the organic encapsulation layer OL may be disposed on the inorganic encapsulation layer IOL. The organic encapsulation layer OL may be disposed directly on the inorganic encapsulation layer IOL, and a lowermost polymer layer Bca-1 of the plurality of polymer layers may be disposed directly on the organic encapsulation layer OL.

The organic encapsulation layer OL may protect the display element layer (see DP-OLED of FIG. 5A) from foreign substances such as dust particles. The organic encapsulation layer OL may include, but not limited to, an acryl-based organic layer.

Figure 7:
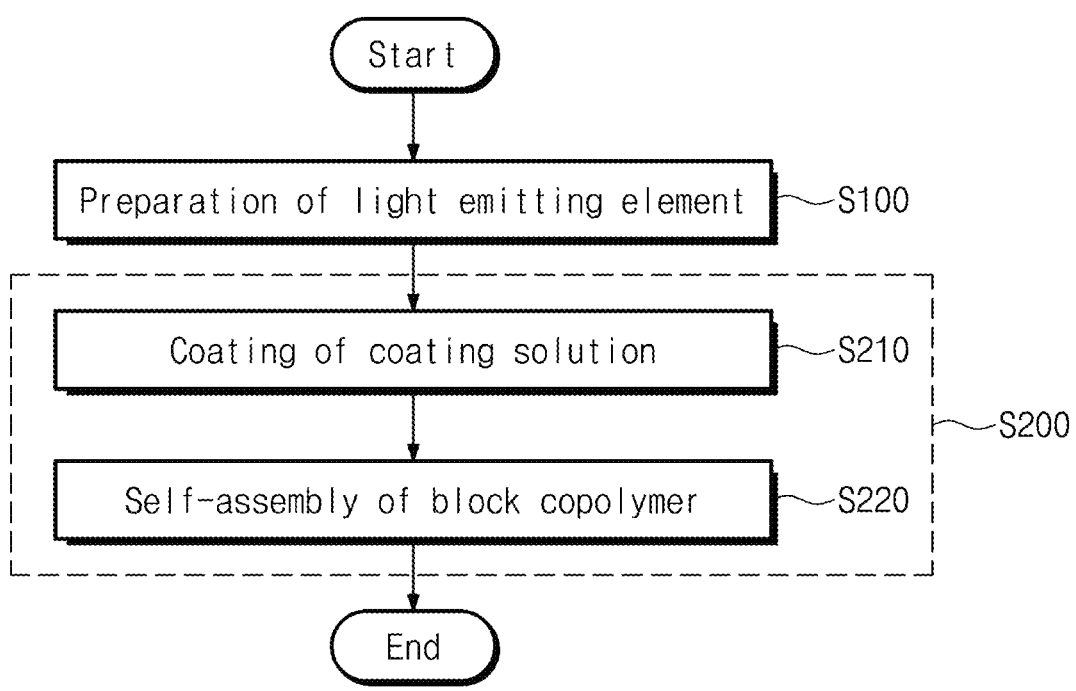
FIG. 7 illustrates a flow chart showing a method of fabricating a display panel according to an exemplary embodiment of the invention.
Figure 8A:
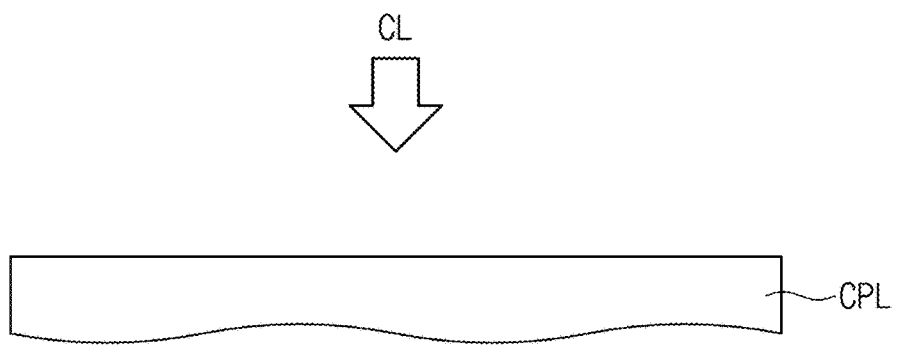
FIGS. 8A to 8C illustrate cross-sectional views showing a method of fabricating a display panel according to an exemplary embodiment of the invention.
Figure 8B:
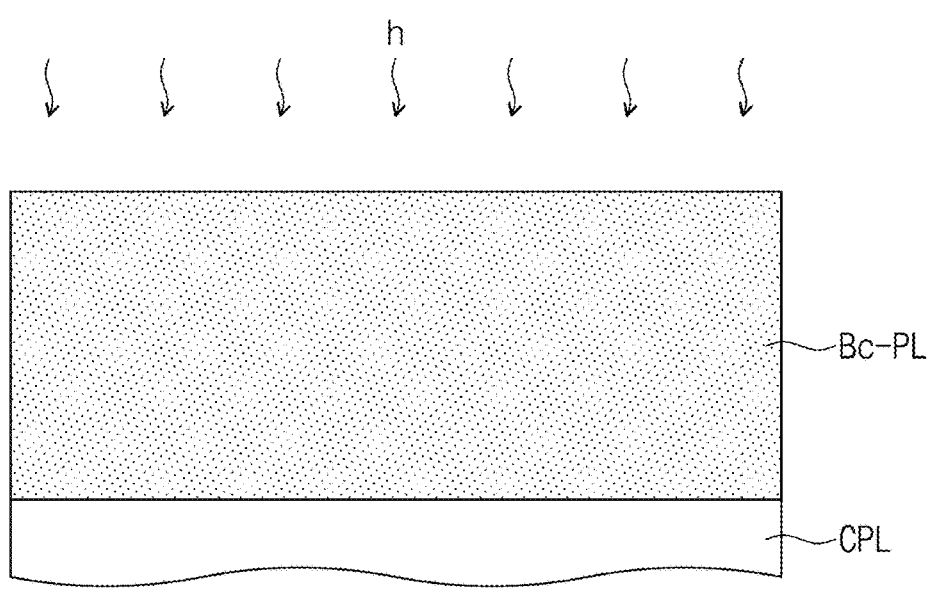
Figure 8C:
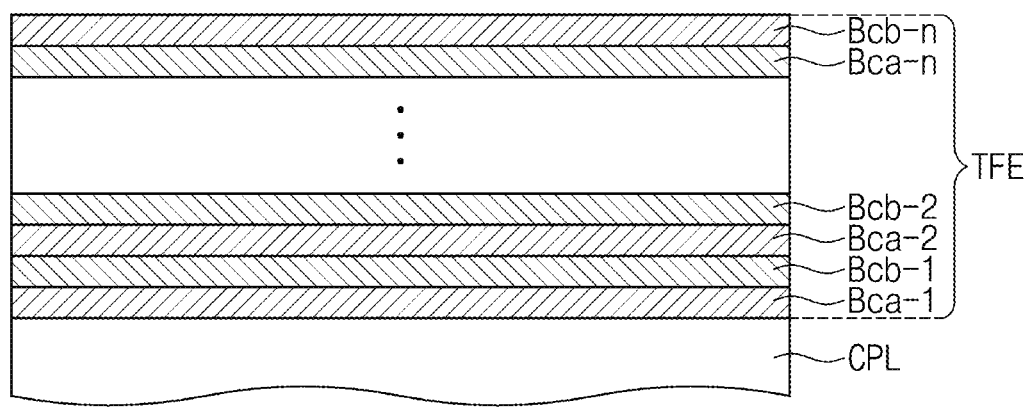

FIG. 7 illustrates a flow chart showing a method of fabricating a display panel according to an exemplary embodiment of the invention. FIGS. 8A to 8C illustrate cross-sectional views showing a method of fabricating a display panel according to an exemplary embodiment of the invention.

FIGS. 8A to 8C sequentially show some processes of a method of fabricating a display panel that corresponds to that illustrated in FIG. 6A. In describing a method of fabricating a display panel according to an exemplary embodiment of the invention with reference to FIGS. 7 and 8A to 8C, the same or like elements as that described above are allocated the same or like reference numerals, and any repetitive detailed description thereof will be omitted.

Referring to FIG. 7, a method of fabricating a display panel according to an exemplary embodiment of the invention may include preparing a light emitting element (S100) and forming an encapsulation layer to cover the light emitting element (S200), where the process S200 may include coating on the light emitting element a coating solution that includes a block copolymer to form a preliminary polymer layer (S210) and allowing the block copolymer to be self-assembled to form a plurality of polymer layers (S220).

Referring together to FIGS. 7, 8A, and 8B, an embodiment of the method of fabricating a display panel may include coating a coating solution CL that includes a block copolymer to form a preliminary polymer layer Bc-PL. The block copolymer may include a first block monomer and a second block monomer. The coating solution CL may be coated by a spin coating, a slit coating, or a screen coating. The coating solution CL may be coated on the capping layer CPL, and thus the preliminary polymer layer Bc-PL may be formed on the capping layer CPL.

Referring together to FIGS. 7, 8B, and 8C, an embodiment of the method of fabricating a display panel may include allowing the block copolymer included in the preliminary polymer layer Bc-PL to be self-assemble to form a plurality of polymer layers. The block copolymer included in the preliminary polymer layer Bc-PL may be self-assembled to form a plurality of first polymer layers Bca-1, Bca-2, . . . , and Bca-n and a plurality of second polymer layers Bcb-1, Bcb-2, . . . , and Bcb-n. Because the block copolymer included in the preliminary polymer layer Bc-PL is self-assembled, the plurality of first polymer layers Bca-1, Bca-2, . . . , and Bca-n may be formed to be disposed alternately with the plurality of second polymer layers Bcb-1, Bcb-2, . . . , and Bcb-n.

The self-assemble of the block copolymer included in the preliminary polymer layer Bc-PL may include drying the preliminary polymer layer Bc-PL and annealing the preliminary polymer layer Bc-PL. The drying may be performed at a room temperature, and may remove a solvent that remains on the preliminary polymer layer Bc-PL. The annealing may be performed by a thermal annealing and a solvent annealing. In an embodiment, as shown in FIG. 8B, the annealing may be performed in such a way that heat h is applied to the coated preliminary polymer layer Bc-PL. Alternatively, the annealing step may be performed by using vapor of an organic solvent, such as acetone or toluene.

Although FIGS. 8A to 8C shows an embodiment in which the block copolymer is self-assembled to form the encapsulation layer TFE illustrated in FIG. 6A, the invention are not limited thereto, and alternatively the block copolymer may be self-assembled to form the encapsulation layer TFE-1 illustrated in FIG. 6B. Alternatively, the method of fabricating a display panel according to an exemplary embodiment may further include depositing on the light emitting element an inorganic material and an organic material to form the inorganic encapsulation layer (see IOL of FIG. 6C) and/or the organic encapsulation layer (see OL of FIG. 6D) before coating the coating solution that includes the block copolymer and allowing the block copolymer to self-assemble.

In an embodiment of the method of fabricating a display panel, the block copolymer may be coated and then self-assembled to form the encapsulation layer TFE, and thus the encapsulation layer TFE may include the polymer layers that are repeatedly and alternatively stacked one on another without separately performing a masking process. In such an embodiment, a molecular structure and a molecular weight of the block copolymer may be adjusted to form a layer structure in which are repeatedly and alternately stacked the plurality of first polymer layers Bca-1, Bca-2, . . . , and Bca-n and the plurality of second polymer layers Bcb-1, Bcb-2, . . . , and Bcb-n whose refractive indices are different from those of the plurality of first polymer layers Bca-1, Bca-2, . . . , and Bca-n. Accordingly, a simplified process may be used to form an encapsulation layer to have a structure that prohibits penetration of light having ultraviolet and near-ultraviolet ranges, and as a result, it may be possible to fabricate a display panel in which reduction in luminous efficiency and lifespan of a light emitting element is effectively prevented.

According to an exemplary embodiment of the invention, because ultraviolet and visible rays are blocked by an encapsulation layer disposed on a light emitting element, the light emitting element may be prevented from being damaged caused by the ultraviolet ray and the visible ray whose wavelength range is close to that of the ultraviolet ray, that is, near-ultraviolet ray, and a display panel may thus increase in reliability.

According to an exemplary embodiment of the invention, a simplified process using the self-assembly of a block copolymer may be performed to form an encapsulation layer that blocks ultraviolet and near-ultraviolet rays, such that a simplified method of fabricating a display panel may be provided.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display panel, comprising:
a light emitting element; and
an encapsulation layer on the light emitting element, wherein the encapsulation layer covers the light emitting element,
wherein the encapsulation layer includes a plurality of polymer layers including a block copolymer,
wherein the plurality of polymer layers include:
a plurality of first polymer layers, each of which has a first refractive index; and
a plurality of second polymer layers, each of which has a second refractive index greater than the first refractive index, wherein the plurality of first polymer layers and the plurality of second polymer layers are alternately stacked one on another,
wherein a difference between the first refractive index and the second refractive index is in a range of about 0.1 to about 0.6,
wherein a transmittance of light in a wavelength range of about 400 nm to about 420 nm in the encapsulation layer is about 10% or less.

2. The display panel of claim 1, wherein
the block copolymer includes a first block monomer and a second block monomer different from the first block monomer,
the plurality of first polymer layers include the first block monomer, and
the plurality of second polymer layers include the second block monomer.

3. The display panel of claim 2, wherein each of the first and second block monomers includes at least one material selected from polystyrene, polymethylmethacrylate, polyethylene oxide, polydimethylsiloxane, fluorohexylethylacrylate, inorganic polymers, and inorganic nano-particles.

4. The display panel of claim 1, wherein the plurality of first polymer layers and the plurality of second polymer layers are alternately stacked with each other.

5. The display panel of claim 4, wherein the plurality of first polymer layers and the plurality of second polymer layers are alternately stacked with each other in two or more layers.

6. The display panel of claim 1, wherein each of the plurality of first polymer layers and the plurality of second polymer layers has a thickness in a range of about 30 nm to about 90 nm.

7. The display panel of claim 1, wherein
the light emitting element includes a first electrode, an emission layer on the first electrode, a second electrode on the emission layer, and a capping layer on the second electrode,
wherein the encapsulation layer is on the capping layer.

8. The display panel of claim 1, wherein the encapsulation layer further includes an inorganic encapsulation layer between the light emitting element and the plurality of polymer layers.

9. The display panel of claim 8, wherein the encapsulation layer further includes an organic encapsulation layer between the inorganic encapsulation layer and the plurality of polymer layers.

10. The display panel of claim 1, wherein
each of the plurality of first polymer layers includes a first sub-polymer layer and a second sub-polymer layer, and
each of the plurality of second polymer layers includes a third sub-polymer layer and a fourth sub-polymer layer.

11. The display panel of claim 10, wherein
each of the first, second, third, and fourth sub-polymer layers is provided in plural, and
the first, second, third, and fourth sub-polymer layers are subsequently and repeatedly stacked one on another.

12. The display panel of claim 1, wherein each of the plurality of first polymer layers and the plurality of second polymer layers has a refractive index in a range of about 1.3 to about 2.3.

13. A display panel, comprising:
a light emitting element; and
an encapsulation layer on the light emitting element, wherein the encapsulation layer covers the light emitting element,
wherein the encapsulation layer includes a plurality of polymer layers including a block copolymer,
wherein the plurality of polymer layers include:
a plurality of first polymer layers, each of which has a first refractive index; and
a plurality of second polymer layers, each of which has a second refractive index different from the first refractive index, wherein the plurality of first polymer layers and the plurality of second polymer layers are alternately stacked one on another,
wherein a transmittance of light in a wavelength range of about 400 nm to about 420 nm in the encapsulation layer is about 10% or less.

14. A method of fabricating a display panel, the method comprising:
preparing a light emitting element; and
forming an encapsulation layer to cover the light emitting element,
wherein the forming the encapsulation layer includes:
coating a coating solution including a block copolymer on the light emitting element to form a preliminary polymer layer; and
allowing the block copolymer included in the preliminary polymer layer to be self-assembled to form a plurality of polymer layers,
wherein the plurality of polymer layers include:
a plurality of first polymer layers, each of which has a first refractive index; and
a plurality of second polymer layers, each of which has a second refractive index greater than the first refractive index, wherein the plurality of first polymer layers and the plurality of second polymer layers are alternately stacked one on another,
wherein a difference between the first refractive index and the second refractive index is in a range of about 0.1 to about 0.6,
wherein a transmittance of light in a wavelength range of about 400 nm to about 420 nm in the encapsulation layer is about 10% or less.

15. The method of claim 14, wherein
the block copolymer includes a first block monomer and a second block monomer different from the first block monomer,
wherein the allowing the block copolymer to be self-assembled includes: causing the first block monomer to form the plurality of first polymer layers; and causing the second block monomer to form the plurality of second polymer layers.

16. The method of claim 14, wherein the allowing the block copolymer to be self-assembled includes forming the plurality of first polymer layers and the plurality of second polymer layers to be alternately stacked with each other.

17. The method of claim 16, wherein the plurality of first polymer layers and the plurality of second polymer layers are alternately stacked with each other in two or more layers.

18. The method of claim 16, wherein
each of the plurality of first polymer layers includes a first sub-polymer layer and a second sub-polymer layer,
each of the plurality of second polymer layers includes a third sub-polymer layer and a fourth sub-polymer layer, and
each of the first, second, third, and fourth sub-polymer layers is provided in plural, and the first, second, third, and fourth layers are subsequently and repeatedly stacked one on another.

19. The method of claim 14, wherein a transmittance of light in a wavelength range of about 380 nm to about 420 nm in the encapsulation layer is about 10% or less.

\* \* \* \* \*